United States Patent [19]

Mitchell et al.

[11] Patent Number: 5,045,852
[45] Date of Patent: Sep. 3, 1991

[54] DYNAMIC MODEL SELECTION DURING DATA COMPRESSION

[75] Inventors: Joan L. Mitchell, Ossining; William B. Pennebaker, Carmel, both of N.Y.; Jorma J. Rissanen, Los Gatos, Calif.

[73] Assignee: International Business Machines Corporation, Armonk, N.Y.

[21] Appl. No.: 502,909

[22] Filed: Mar. 30, 1990

[51] Int. Cl.$^5$ ............................................. H03M 7/48
[52] U.S. Cl. ....................................... 341/51; 341/65; 341/67
[58] Field of Search ....................... 341/51, 65, 67, 95

[56] References Cited

U.S. PATENT DOCUMENTS

| | | | |
|---|---|---|---|
| 3,394,352 | 7/1968 | Wernikoff et al. | 341/51 |
| 4,286,256 | 8/1981 | Langdon, Jr. et al. | 341/65 |
| 4,646,061 | 2/1987 | Bledsoe | 341/65 |
| 4,730,348 | 3/1988 | MacCrisken | 375/122 |
| 4,891,643 | 1/1990 | Mitchell et al. | 341/107 |
| 4,905,297 | 2/1990 | Langdon, Jr. et al. | 341/95 |
| 4,929,946 | 5/1990 | O'Brien et al. | 341/95 |

Primary Examiner—A. D. Pellinen
Assistant Examiner—Marc S. Hoff
Attorney, Agent, or Firm—Thomas P. Dowd

[57] ABSTRACT

A system and method for maximizing data compression by optimizing model selection during coding of an input stream of data symbols, wherein at least two models are run and compared, and the model with the best coding performance for a given-size segment or block of compressed data is selected such that only its block is used in an output data stream. The best performance is determined by 1) respectively producing comparable-size blocks of compressed data from the input stream with the use of the two, or more, models and 2) selecting the model which compresses the most input data. In the preferred embodiment, respective strings of data are produced with each model from the symbol data and are coded with an adaptive arithmetic coder into the compressed data. Each block of compressed data is started by coding the decision to use the model currently being run and all models start with the arithmetic coder parameters established at the end of the preceding block. Only the compressed code stream of the best model is used in the output and that code stream has in it the overhead for selection of that model. Since the decision as to which model to run is made in the compressed data domain, i.e., the best model is chosen on the basis of which model coded the most input symbols for a given-size compressed block, rather than after coding a given number of input symbols, the model selection decision overhead scales with the compressed data. Successively selected compressed blocks are combined as an output code stream to produce an optimum output of compressed data, from input symbols, for storage or transmission.

20 Claims, 1 Drawing Sheet

DYNAMIC MODEL SELECTION DURING DATA COMPRESSION

BACKGROUND OF THE INVENTION

1. Field of the Invention

The present invention relates to data compression and more particularly to a method and means for dynamically selecting among coding models to be used during the compression coding of a stream of data to optimize the compression of various portions of the data stream and thus of the entire stream.

2. Problem Solved

To provide an efficient general technique for selecting between two, or more, models for use in compressing data by compression coding techniques, so as to utilize the optimum model for each section of the data being compressed.

3. Prior Art

Various models are known for the compression coding of sets of data. Each establishes a context for the purpose of estimating the probability distribution of the data items or symbols. Typically, a model describing a given entity, such as binary facsimile images, is optimized to provide good compression for a given set of data representing such an image. An example of this is the well-known Huffman coding. Unfortunately, the image model that optimizes compression for one given set of data will most likely perform poorly when applied to a second data set that has significantly different statistical properties. Conversely, a model which is optimized for best compression of the second data set can be expected to perform poorly on the first data set. Although it would be desirable to devise a single model to operate on the entire range of possible data sets, the varying statistical properties of these data sets suggests that any single model optimized for all data sets will provide performance which is a compromise relative to the best possible performance for any single data set or section of a data set. Clearly, the best performance would be realized if the best model could be selected in a dynamic fashion during coding for each data set or portion thereof when being coded.

Although model selection generally has been used in the prior art, the techniques have either:

1. been deterministic, using measures cleverly derived from the data structure, such as disclosed in U.S. Pat. No. 3,394,352, issued July 23, 1968 to R. Wernikoff et al, entitled "Method of and Apparatus for Code Communication", making it effectively a single, more complex, model; or 2. used one of two alternatives, such as disclosed by K. Toyokawa in U.S. Pat. No. 4,901,363, issued Feb. 13, 1990, entitled "System for Compressing Bi-Level Data", involving an arithmetic coding technique for dither halftone images; or 3. used Huffman coding of the selection decision for each block of data, such as disclosed in U.S. Pat. No. 3,830,964, issued Aug. 20, 1974, to D. R. Spencer, entitled "Apparatus and Method for Transmitting a Bandwidth Compressed Digital Signal Representation of a Visible Image".

In the third case, the basic idea involves measuring the coding rate for two different models used in compressing the same block of input data and selecting the most efficient model for that block. However, in this and related prior art, such as, U.S. Pat. No. 4,730,348, issued Mar. 8, 1988 to J. E. MacCrisken, entitled "Adaptive Data Compression System", which use encoding tables, the test interval has always been a block of input data of a given size, and since fixed code assignments have been used, this approach has generated a substantial additional cost in terms of bits needed to code the model selection.

When arithmetic coding is used to compress data, (see G. G. Langdon, "An Introduction to Arithmetic Coding", IBM Journal of Research and Development, Vol. 28, No. 2, pps. 135–149, Mar. 1984), the compression procedure can be divided into two parts:

1. a model section which generates a series of binary decisions from a stream of input symbols and the contexts for those decisions; and 2. an adapter/coder section which estimates the probability for each decision, in the given context, and codes it.

The adaptive nature of this coding process offers the advantage that when a given decision can be predicted with a high probability of success, the cost in terms of compressed bits for making that decision is very low. If this technique is applied to model selection, then when a given data set is compressed much better by one model as compared to another, coding the decision to use the better model does not add much overhead to the compressed data stream.

In "Adaptive Models for Nonstationary Sources", IBM Internal Report RJ 4673, Apr. 24, 1985, M. Wax, J. Rissanen, and K. Mohiuddin, apply the principle, described by present co-inventor J. J. Rissanen in "A Predictive Minimum Description Length Principle", IBM Internal Research Report RJ 5002, January 1986 (also available as "Stochastic Complexity and Modeling" in Ann. of Statistics, September, 1986), to probability estimation for arithmetic coders. The basic idea set forth therein, simply stated, is to maintain a number of measures of probability, and as each symbol is coded, select the measure which currently provides the shortest code stream. In the preferred embodiment, the present invention involves the application, in modified form, of Rissanen's Predictive Minimum Descriptor Length (PMDL) principle, to the problem of dynamic model selection when the models are being coded by arithmetic coding techniques. In particular, the invention applies an inverse form of the PMDL concept—the maximizing of the amount of a data set sent in a given block of compressed data—to provide a mechanism for selecting between two, or more, models.

It is therefore an object of this invention to provide an efficient general technique for selecting among various models for use in compressing data by various compression coding techniques, so as to utilize the optimum model for each section of the data being compressed.

SUMMARY OF THE INVENTION

Accordingly, the invention embodies a method and means for applying improved coding procedures to the concept of model selection wherein at least two models are run, e.g., in parallel in a hardware implementation, and the model with the best coding performance for a given set or segment of compressed data is used. More specifically, the best performance is determined by 1) respectively producing comparable-size segments or blocks of compressed data with the use of two, or more, models and 2) selecting the model which compressed the most input data. This is in contrast to the prior art approach of 1) compressing a given-size set of input data using each model and 2) determining the best model by the respective sizes of the compressed output data. In the preferred embodiment, both the decision sequence produced with a given model and the model selection decision are coded with an adaptive arithmetic coder into the compressed data. Each segment or block of compressed data is started by coding the decision to use the model currently being run. All models start with the arithmetic coder parameters established at the end of the preceding block. Only the compressed code stream of the best model is used in the output and that code stream has in it the overhead for selection of that model. Since the decision as to which model to run is made in the compressed data domain, rather than after coding a given number of input symbols, the model selection decision overhead scales with the compressed data. The best model is chosen on the basis of which model coded the most input symbols for a given-size compressed block so that the model or models which lose the contest do not code as much of the input data set. Successively selected compressed blocks are combined as an output code stream to produce an optimum output of compressed data, from input symbols, for storage or transmission.

Further inventive features involve the use of characteristic least probable symbols (LPS) in the input data stream to determine when a selection is made, i.e., a block is completed. The decision to switch is made only after an LPS has been coded. While the sizes of the compressed blocks to be selected may vary slightly as a result, this feature removes an instability in the model selection. Also, the statistics for the unused model paths are reset to the values they had at the start of the block. Thus, the means used to decode the code stream is a single pass decoder. The shift count in the augend register used in arithmetic coding is used to determine when a block is complete, thereby avoiding extra computations when bit stuffing is required.

Although the preferred embodiment is directed to arithmetic coding, the technique of the invention for model selection is totally general, and can be applied to virtually any data compression problem where two or more models exist, and can use any form of compression coding.

DETAILED DESCRIPTION OF THE PREFERRED EMBODIMENT

Figure 1:
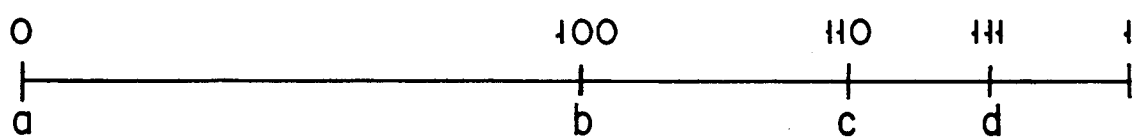
FIG. 1 illustrates a number line or unit interval, from 0 to 1, used in arithmetic coding, with events a, b, c, and d represented as code points on the line, dividing it into four subintervals, each corresponding in width to the estimated probability and identified with the symbol at its leftmost point.

The present invention is directed to providing an efficient general technique for selecting among any number of models for compressing data, and preferably data being coded by arithmetic coding techniques, so as to utilize the optimum model for each section of the data being compressed. For a thorough understanding of the significance of all of the features of the preferred embodiment in the following description it is recommended that the pertinent articles cited in the BACKGROUND section be studied to obtain a good working knowledge of arithmetic coding. Also, the following patents provide teachings of specific improved implementations of arithmetic coding that may be of interest:

U.S. Pat. No. 4,286,256, issued Aug. 25, 1981, to G. G. Langdon, Jr. and J. J. Rissanen, entitled "Method and Means for Arithmetic Coding Using a Reduced Number of Operations".

U.S. Pat. No. 4,369,463, issued Jan. 18, 1983, to D. Anastassiou and J. L. Mitchell, entitled "Gray Scale Image Compression with Code Words a Function of Image History".

U.S. Pat. No. 4,633,490, issued Dec. 30, 1986, to J. L. Mitchell and G. Goertzel, entitled "Symmetrical Adaptive Data Compression/Decompression System".

U.S. Pat. No. 4,463,342, issued July 31, 1984, to G. G. Langdon and J. J. Rissanen, entitled "A Method and Means for Carry-Over Control in a High Order to Low Order Combining of Digits of a Decodable Set of Relatively Shifted Finite Number Strings".

U.S. Pat. No. 4,652,856, issued Feb. 4, 1986, to K. M. Mohiuddin and J. J. Rissanen, entitled "A Multiplication-free Multi-Alphabet Arithmetic Code".

U.S. Pat. No. 4,891,643, issued Jan. 2, 1990, to J. L. Mitchell and W. B. Pennebaker, entitled "Arithmetic Coding Data Compression/De-compression By Selectively Employed, Diverse Arithmetic Encoders and Decoders".

U.S. Pat. No. 4,905,297, issued Feb. 27, 1990, to G. G. Langdon Jr., J. L. Mitchell, W. B. Pennebaker, and J. J. Rissanen, entitled "Arithmetic Coding Encoder and Decoder System".

and allowed applications

U.S. Ser. No. 193,170, filed May 3, 1988, by J. L. Mitchell and W. B. Pennebaker, entitled "Probability Adaption for Arithmetic Coders".

U.S. Ser. No. 222,332, filed July 20, 1988, by W. B. Pennebaker and J. L. Mitchell, entitled "Probability Estimation Based on Decision History".

The teachings in the foregoing articles and patents are incorporated herein by reference to aid in a full understanding of all of the details and advantages of the arithmetic coding technique utilized in the present invention.

For the purpose of understanding the following description of the features of the preferred embodiment of the present invention, it firstly should be appreciated that in implementing arithmetic coding for achieving data compression and decompression, an input stream of data, e.g., in the form of successive symbols, is acted upon, within a computer, to produce strings of decisions or data that are coded into an output stream of compressed data for storage or transmission. The compressed data stream can, in turn, be decoded to reproduce the input stream.

More particularly, a symbol may be defined, for present purposes, as an element of source data, representative of some physical entity, to be encoded in one iteration of the coding algorithm. It generally may be taken from a large alphabet. For instance, a byte of data is a symbol from an alphabet with 256 elements and thus such a symbol can take on any of 256 values. From a stream of symbols, a series of strings of decisions or data, based on phenomena or events related to the physical entity, are generated using a model. An event is a happening with an outcome which is not known in advance. The model provides a context for the decisions, which context is derived from a subset or other function of the source data and aids in estimating the probability distribution of the successive symbols. An adapter/coder estimates the probability for each decision, in the given context, and codes it. In the arithmetic coding process, one decision after another in a data stream is encoded to define successively smaller, lesser-included, intervals along a number line. The first interval, for example, may be from 0 to 1. As each decision is encoded the current interval is divided into segments, each of which corresponds to one possible outcome for the next decision. If there are only two possible outcomes for each decision (i.e., each decision=a binary event), the current interval is divided into two segments with the length of each segment being based on its respective associated probability. The probabilities may remain fixed or may adapt as decision data is encoded. It is the correlating of larger segments to symbols which occur with greater frequency that leads to a compression effect.

By way of a specific illustration, in the above-cited article "An Introduction to Arithmetic Coding", a 4-symbol arithmetic coding example is set forth in which each decision can result in either an "a" event (having a 50% probability), a "b" event (having a 25% probability), a "c" event (having a 12.5% probability), or a "d" event (having a 12.5% probability). These events can be represented along a number line in the manner shown in FIG. 1 hereto, wherein they are code points on the line, or unit interval, from 0 to 1. The unit interval is divided into four subintervals, each identified with the symbol corresponding to its leftmost point. The subinterval for symbol "a" in binary fraction form is from 0 to 0.1, for "b" is from 0.1 to 0.11, for "c" is from 0.11 to 0.111, and for "d" is from 0.111 to 1.0, with the subintervals including their starting points but not their end points. It will be noted that the subinterval to the right of each code point has a width or size corresponding to the probability of its symbol, e.g., for "a" it is ½ the unit interval and for "d", ⅛. Alternatively, representing the four events in binary form would require two bits for each decision, the events being represented respectively by 00, 01, 10, and 11.

Figure 2:
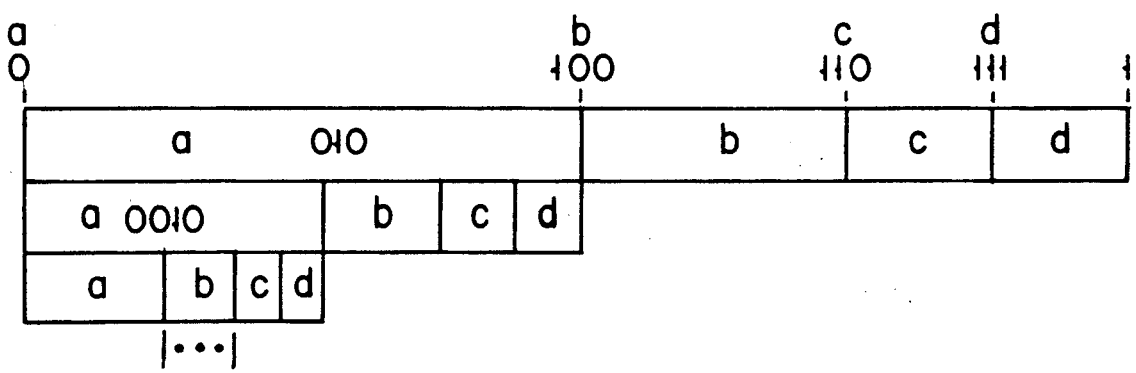
FIG. 2 illustrates a number line as in FIG. 1 showing the successive subdivisions of the unit interval for coding the data string "aab".

In comparing the coding approaches, it will be seen that for a three decision set, such as "aab", which has a high probability, the straightforward uncoded data would be 00 00 01, requiring six bits. However, as observed from FIG. 2, the arithmetic coding approach permits the sequence "aab" to be represented by the value 0.001. Briefly, the arithmetic coding process proceeds as follows: given the encoded "a" subinterval (0, 0.1), this interval is next subdivided into the same proportions as the original unit interval, so that the subinterval assigned to the second "a" symbol is (0, 0.01); and, for the third symbol "b", subinterval (0, 0.01) is subdivided to result in a subinterval of (0.001, 0.011). Thus, instead of the six bits in binary form, the "aab" information can be represented in three bits, i.c., 0.001.

This conservation of bits results as sucessive events having relatively high associated probabilities occur. On the other hand, the conservation deteriorates if numerous events occur for which there are low probabilities and relatively short line segments. Hence, with the above-noted probabilities, a sequence of events "dd" would be represented by 0.111111. Consequently, if the larger segments are made to correspond to events which occur with correspondingly greater frequency, the additional bits needed for less probable symbols are outweighted by the conservation achieved when more probable symbols occur. It is therefore important to ensure that the associated probabilities (and segment lengths corresponding thereto) reasonably track the actual probabilities of the respective events.

Various techniques have been proposed for estimating event probabilities as more decision data history is gathered. A general approach to adapting a probability estimator is set forth in the above-cited, allowed, co-pending application of present co-inventors W. B. Pennebaker and J. L. Mitchell, Ser. No. 222,332, filed July 20, 1988, entitled "Probability Estimation Based on Decision History", which has been incorporated herein by reference above to assist in providing an understanding of the environment of the present invention. As will be appreciated from the brief preceding description, the code points which delimit the interval partitions are treated as magnitudes, so that to define an interval, the leftmost point C and the interval width A are specified. The values of these two parameters may be held in two shift registers with A being available for further partitioning. During encoding, a recursion operation is begun, with "current values" of code point C and available width A, which operation uses the value of the symbol encoded to determine "new" values of C and A. The leftmost point of the new interval is the sum of the current code point value C and the product of the interval width A of the current interval and the cumulative probability $P_i$ for the symbol i being encoded, i.e.,:

$$\text{New } C = \text{Current } C + (A \times P_i).$$

For example, after encoding "aa", the current code point C is 0 and the interval width A is 0.01. For "aab", the new code point is 0.001, determined by current C=0 plus the product of A and $P_i$, i.e. (0.01×0.100). The width A of the current interval is the product of the probabilities of the data symbols encoded so far, i.e., $$\text{New } A = \text{Current } A \times P_i$$

where $P_i$ is the probability of the current symbol i, so that after encoding "aab", the interval width is (0.1)×(0.1)×(0.01) giving 0.0001.

Accordingly, in a simpler embodiment, such as that disclosed in the above-cited U.S. Pat. No. 4,905,297, a plurality of possible probability values Qe for an event are prescribed, such as in a table. A number-line interval, or augend value, A is defined and, with each decision, the augend value is reduced. The amount by which the augend value is reduced is event dependent. That is, in a binary application in which each decision may result in the entry of either 1) a less probable symbol (LPS), having a current estimated probability Qe, or 2) a more probable symbol (MPS), the entering of an LPS results in the augend value being reduced to the current Qe value, and the entering of an MPS results in the augend value A being computed as A−Qe. If the up-dated value of A is less than a pre-defined minimum AMIN (which is greater than the highest value of Qe), the up-dated value is renormalized (preferably by doubling) until A again is at least AMIN. A fundamental concept of the technique in the co-pending application is that the value of Qe is up-dated each time A is renormalized. If renormalization follows an LPS event, the Qe value (representing the estimated probability of the LPS event) is increased. If renormalization follows an MPS event, the Qe value diminishes. By linking Qe changes to augend value renormalization, the time for Qe change is readily determined without the need for counters and, contrary to prior techniques, provides close tracking of actual Qe probability over the Qe values. The line interval or augend value A being normally held in a shift register (an augend or A register) in a computer, normalization may be achieved by shifting out the most significant 0 bits.

In addition to adapting probabilities based on an updated decision history, the implementation of arithmetic coding involves other problematic aspects, such as "carry propagation" and "borrow propagation". The "carry propagation" problem is noted with reference to a first type of arithmetic coding encoder which up-dates a code stream C with successive decision inputs in accordance with the following conventions:

(1) if the symbol being encoded is an LPS, C remains the same in value and the current interval becomes New A=Qe; and (2) if the symbol being encoded is an MPS, C is updated to C+Qe and the current interval becomes New A=Current A−Qe.

As the interval A becomes smaller and much smaller intervals are added to C, the precision of C (i.e., the length of the code stream) increases. The precision may extend without any fixed limit as long as decision data is entered for encoding.

Because C can be of indeterminate length (and precision) but only limited memory is available in the computer for containing code stream information, there may be a problem if a carry occurs. In particular, if the code stream value is a sequence of several hundred 1's but only the most recent bits of C are contained in a shift register (a code or C register), a problem results if some A is to be added to C. The carry will not be able to propagate through the several hundred 1 bits because only the most recent bits are accessible. One solution to carry propagation is referred to as bit-stuffing and is known in the prior art. The bit-stuffing of the prior technology suggests the insertion of at least one carry-receiving bit after a prescribed number of 1 bits in a row.

Utilizing the preceding information on arithmetic coding parameters and their environment, the features of the preferred embodiment of the present invention will now be specifically described. Firstly, in evaluating model selection in accordance with the invention, the preferred approach incorporates the following steps or considerations:

1. Two, or more, models are run, effectively in parallel in a hardware implementation, until a new block of compressed data greater than or equal to a given-size length is generated by each model from an input data stream of successive symbols representing physical phenomena, which symbols are used to produce a series of decisions or like data that is arithmetically coded. Each model starts with the augend (A) register, code (C) register and previous compressed data of the arithmetic coder at the same starting point, and a separate statistics area is set aside in the computer for each model.

2. The first decision (or decisions) coded at the of each compressed block for each model identifies the model being run. Thus, each model codes the decision that would select that model. The decision for model selection is conditioned on the model used for the previous block. In many cases, this will favor continuation of a given model, which may be referred to as the "primary" model.

3. A check for the completion of a block of compressed data is made after the completion of the coding of a symbol—including all required renormalization.

4. The test for the end of the block is made only when a less probable symbol (LPS) is coded or decoded when binary arithmetic coding is being used. This will result in the "given-size" for the compressed blocks possibly differing slightly in size for different models, but all such blocks will be of substantially the same size, i.e., of comparable sizes that are compatible for the purposes of the invention.

5. The length of coded data for the current block can be measured in terms of the augend shift count, thereby avoiding complexities introduced by bit stuffing in the actual coded data stream.

6. The model which has compressed the most input symbols in the current block is selected.

7. The compressed data stream or block generated by the best model is added to the output data stream, and the statistics on the models which were not selected are reset to the values in effect at the start of the block.

Because of steps 2 and 7, the decoder need only run the best model for each block when decompressing the data. Thus, although the encoder's computational effort is increased approximately in proportion to the number of models being run, the decoder is a single pass decoder.

EXPERIMENTAL VERIFICATION

The foregoing considerations were confirmed as being variously desirable in a coding test which used two 7-pel predictors as the two models. One, the 7-pel predictor "Preuss" model (see G. G. Langdon and J. Rissanen, "Compression of Black-White Images with Arithmetic Coding", IEEE Trans. Commun. Vol. COM-29, No. 6, June, 1981), when used with arithmetic coding techniques, has been found to achieve excellent compression on the standard CCITT document set, CCITT1-CCITT8, (see R. Hunter and A. Robinson, "International Digital Facsimile Coding Standards", Proc. IEEE 68, No. 7, 1980), but fares relatively poorly on digital halftone images. The other, a simple horizontal 7-pel predictor (i.e. the last seven pels) has been found to work well on digital halftones but poorly, relative to the "Preuss" model, on the standard CCITT images. Because of the rather different behavior on the two classes of images, these two models provided an excellent basis for testing the model selection algorithm of the present invention. The arithmetic coder used for the experiments was the version of the "Q-Coder" described in an article by co-inventors W. B. Pennebaker and J. L. Mitchell, in the IBM J. Res. Develop., Vol. 32, No. 6, pps. 753–774, November 1988, entitled "Software implementations of the Q-Coder". The Preuss model data was developed using a "Q-Coder" with a 7-bit template model as described in another article in the same IBM Journal of Research and Development of November 1988, at pps. 775–795, entitled "A multi-purpose VLSI chip for adaptive data compression of bi-level images", by R. B. Arps et al.

The three tables below provide experimental evidence supporting the efficacy of the use of the seven steps indicated above. In Tables I and II, in the column headed "model", '2D' refers to the 2-dimensional Preuss model, '1D' refers to the horizontal 7-pel predictor model, '2V' refers to model selection where the 2D model is the primary model (selected if the performance of both is equal), and '1V' refers to model selection where the 1D model is the primary model. '1Vr' and '2Vr' indicate statistics were reset for the unused model. In the column headed "block", '32' indicates that the model selection was done every 32 (or more) compressed bits. Except where specifically noted, the column on the right is the total compressed bit count for a fully decodable file.

Table I: Test data showing results of dynamic model selection relative to either model alone. CCITT2 is a facsimile image of a circuit drawing from the CCITT document set and boat2x is a rotated version of a relatively small digital halftone image of boats shown and discussed in the above-cited R. B. Arps et al article in the IBM Journal of Research and Development of November 1988.

| image | parameters model | block | fraction in primary model | compressed bits |
|---|---|---|---|---|
| CCITT2 | 2D | 32 | — | 71552 |
| CCITT2 | 1D | 32 | — | 179344 |
| CCITT2 | 2Vr | 32 | 1.00 | 71464 |
| CCITT2 | 1Vr | 32 | 0.15 | 72672 |
| boat2x | 2D | 32 | — | 155048 |
| boat2x | 1D | 32 | — | 139608 |
| boat2x | 2Vr | 32 | 0.41 | 120016 |
| boat2x | 1Vr | 32 | 0.62 | 119984 |

Table II: Test data showing insensitivity to block size. Performance data for the two models run separately is found in Table I.

| image | parameters model | block | fraction in primary model | compressed bits |
|---|---|---|---|---|
| CCITT2 | 2Vr | 64 | 1.00 | 71488 |
| CCITT2 | 2Vr | 56 | 1.00 | 71472 |
| CCITT2 | 2Vr | 48 | 1.00 | 71576 |
| CCITT2 | 2Vr | 40 | 1.00 | 71576 |
| CCITT2 | 2Vr | 32 | 1.00 | 71464 |
| CCITT2 | 2Vr | 28 | 1.00 | 71552 |
| CCITT2 | 2Vr | 24 | 1.00 | 71560 |
| CCITT2 | 2Vr | 20 | 1.00 | 71504 |
| CCITT2 | 2Vr | 16 | 1.00 | 71536 |
| CCITT2 | 2Vr | 12 | 1.00 | 71704 |
| CCITT2 | 2Vr | 8 | 1.00 | 72200 |
| boat2x | 2Vr | 64 | 0.33 | 124056 |
| boat2x | 2Vr | 56 | 0.36 | 123136 |
| boat2x | 2Vr | 48 | 0.35 | 122208 |
| boat2x | 2Vr | 40 | 0.39 | 121296 |
| boat2x | 2Vr | 32 | 0.41 | 120016 |
| boat2x | 2Vr | 28 | 0.42 | 120184 |
| boat2x | 2Vr | 24 | 0.46 | 120056 |
| boat2x | 2Vr | 20 | 0.47 | 120328 |
| boat2x | 2Vr | 16 | 0.51 | 119792 |
| boat2x | 2Vr | 12 | 0.52 | 120064 |
| boat2x | 2Vr | 8 | 0.54 | 121696 |

Table III: Synopsis of results on a number of test files. All numbers quoted here are with the 2D model as the primary model, and with statistics resetting for the unused model.

| Image | Compressed Bits MMR | 2D | 1D | % 1D in V | V |
|---|---|---|---|---|---|
| TEXT: | | | | | |
| CCITT1 | 144920 | 120104 | 211584 | 3 | 119680 |
| CCITT2 | 86520 | 71552 | 179344 | 0 | 71464 |
| CCITT3 | 229744 | 188424 | 392152 | 5 | 186560 |
| CCITT4 | 554248 | 447408 | 697064 | 5 | 447480 |
| CCITT5 | 257872 | 215864 | 420776 | 1 | 215184 |
| CCITT6 | 133304 | 112432 | 303496 | 1 | 111280 |
| CCITT7 | 554352 | 469304 | 780216 | 0 | 468848 |
| CCITT8 | 152888 | 124952 | 356032 | 0 | 125000 |
| total | 2113848 | 1750040 | 3340664 | | 1745496 |
| HALFTONES: | | | | | |
| budking | 2651736 | 969248 | 626424 | 59 | 555928 |
| boat2x | 325952 | 155048 | 139608 | 59 | 120016 |
| jphmesh | 559552 | 184984 | 87512 | 82 | 86800 |
| supc** | 396520 | 142192 | 96880 | 53 | 87304 |
| supc240* | 395520 | 133976 | 85600 | 77 | 80408 |
| dit** | 563624 | 133616 | 107032 | 49 | 96264 |
| dit240* | 562216 | 126632 | 95896 | 70 | 89368 |
| erd** | 727024 | 190472 | 235424 | 10 | 186040 |
| erd240* | 725240 | 184840 | 221664 | 16 | 181424 |
| panda** | 193224 | 93224 | 71464 | 39 | 67624 |
| panda240* | 192424 | 90040 | 62384 | 75 | 62480 |
| pandaq** | 190328 | 91592 | 64176 | 48 | 60280 |
| pandaq240* | 189560 | 88208 | 55320 | 76 | 55344 |
| combo6 | 3695528 | 1875832 | 1516720 | 52 | 1298472 |
| total | 11368448 | 4459904 | 3466104 | | 3027752 |

*files (90 bytes/line) halftoned with 5 techniques from the same original grayscale image.
**padded white on the right edge to 216 bytes/line.

The MMR algorithm used was the variation on the CCITT Group 4 algorithm described in the IBM J. Res. Develop. Vol. 31, No. 1, pps. 16–31, January 1987, article of K. L. Anderson, F. C. Mintzer, G. Goertzel, J. L. Mltchell, K. S. Pennington, and W. B. Pennebaker, entitled "Binary-Image-Manipulation Algorithms in the Image View Facility".

The first two halftone images are the digital halftone images discussed in the above-cited G. G. Langdon and J. Rissanen article in IEEE Trans. Commun. Vol. COM-29, No. 6, June, 1981.

The third halftone is mentioned in an article by W. B. Pennebaker and J. L. Mitchell, IBM J. Res. Develop., Vol. 32, No. 6, pps. 737–752, November 1988, entitled "Probability Estimation for the Q-Coder".

The next ten halftone images are two versions each of those described in the IBM J. Res. Develop. Vol. 31, No. 1, pps. 32–43, January 1987, article of Y. Chen, F. Mintzer, and K. Pennington, entitled "PANDA: Processing Algorithm for Noncoded Document Acquisition".

The last halftone is FIG. 16 in the IBM J. Res. Develop. Vol. 31, No. 1, pps. 32–15, January 1987, article of G. Goertzel and G. R. Thompson, entitled "Digital Halftoning on the IBM 4250 Printer".

Also see Table 2 on page 759 of the IBM J. Res. Develop., November 1988.

Although, as previously indicated, model selection has been tried in several different senses in the past, it will be seen that the present preferred technique improves upon the prior art in a number of significant ways. For example:

1. The model selection decision may be arithmetically encoded with each block of compressed data being started by coding the decision to use the model currently being run. All models start with arithmetic coder parameters established at the end of the preceding block. Only the compressed code stream for the best model is sent for storage or transmission, and that code stream has in it the overhead for selection of that model.

2. The decision as to which model to run is made in the compressed data domain rather than after coding a given number of input symbols. The model selection decision overhead therefore scales with the compressed data. The best model is chosen on the basis of which model coded the most input symbols for a given-size compressed block. The models which lose the contest do not code as much of the input data set. Thus, the amount of input data coded is maximized for the time taken for the selection process.

3. The decision to switch, i.e., conclude a block at a given size, is made only after a less probable symbol (LPS) has been coded. Consequently, the blocks for each model may differ slightly in size, but will remain comparable for the purposes of model selection. This approach, however, removes an instability in the model selection.

4. The statistics, or probability estimates, for the unused model paths are reset to the values they had at the start of the block. The decoder is therefore a single pass decoder.

5. The augend register shift count may be used to determine when a block is complete, thereby avoiding extra computations when bit stuffing is required.

While the preferred embodiment was essentially described in terms of, and the experimental verifying tests above were done using, two particular models and binary arithmetic coding, it should be recognized that the technique for model selection of the present invention is totally general, and can be applied to virtually any data compression problem where two or more models exist, and can use any form of compression coding.

It is contemplated that an embodiment may be included wherein the size of the compressed data block is compared with the size of the input data processed and a switch to a "no compression" model made if the models are expanding the input data. Also, as noted above, a primary model is the model used first based on the prior model used, so that when a tie occurs between the primary model and another model, the primary model is preferably chosen to avoid switching models. Further in this regard, a threshold may be selected for the primary model based on the number of input symbols coded per compressed data block. Then, as long as the number of input symbols compressed exceeds the threshold the alternate models would not be processed. Accordingly, when the primary model is achieving excellent compression the encoder can be a one-pass encoder.

It is also contemplated that the inventive technique of using the amount of compressed data output by a given model in the selection process can be applied to variable length coding in determining the adapting interval for generating new variable length codeword tables. Again, only the model selected would have its variable length codeword table changed.

In the preferred embodiment, a model identifier is incorporated at the start of each block to inform the decoder of the model selected for compression. The decoder is adapted to know when to look for the identifier based on the amount of compressed data received. Alternatively, the encoder and decoder can look to the past history of the encoded data for identifying the model used for the next block of compressed data in order to obviate the coding of the model identifier.

It will be appreciated that the invention can be implemented in either hardware or software. In the former case, the functions may be incorporated in a VLSI chip, of a type such as IBM's Adaptive Bilevel Image Compression (ABIC) chip, discussed in the above-cited R. B Arps et al. article in the IBM Journal at pps. 775–795, and in the latter case, the software may be adapted to run on a general purpose computer, such as an IBM S/370.

What is claimed is:

1. A computerized method of maximizing the compression of a stream of input symbols by dynamically selecting the best of a plurality of data compression models for respectively encoding each of successive portions of said stream, wherein each model, in response to input symbols, generates encoded data, based on model characteristics, in the form of respective strings of data, comprising the steps of:

beginning with the same input symbol in said stream, using each model to generate respective strings of data from the stream of input symbols;

compression coding said strings of data to produce blocks of compressed data, each of said blocks being at least equal to a given size;

selecting the respective block of compressed data for which the most input symbols have been compressed;

adding the selected block of compressed data to an output data stream; and beginning with the input symbol following the last symbol input to said selected model, reiterating the foregoing steps on the next succeeding portion of said input symbol stream.

2. The method of claim 1 wherein the compression coding step comprises arithmetic coding.

3. The method of claim 1 wherein the compression coding step comprises binary arithmetic coding and said blocks of compressed data are only completed after a less probable symbol has been coded.

4. The method of claim 1 further comprising the steps of:

coding a model identifier at the start of each block of compressed data indicative of the model producing the respective block; and including the model identifier for the selected block therein when adding the selected block of compressed data to the output data stream.

5. The method of claim 4 wherein said model identifier is used to decode the compressed data block.

6. The method of claim 1 wherein the past history of said respective strings of data is used for identifying the model to be used for the next block of compressed data.

7. The method of claim 6 wherein a threshold value is selected based on the number of input symbols coded per compressed data block, and said model to be used for the next block of compressed data continues to be used, and alternate models are not processed, as long as said threshold value is exceeded by the number of input symbols coded per compressed data block.

8. The method of claim 1 wherein said blocks of compressed data have probability estimation values associated therewith and further comprising the step of resetting the probability estimation values for the models not selected to the previous estimation values at the start of the production of the next block.

9. The method of claim 1 wherein one of said models comprises comparing the size of the selected block of compressed data to the size of the number of input symbols that have been compressed and selecting the smaller of the two for adding to the output data stream.

10. The method of claim 1 wherein the compression coding step comprises variable length coding.

11. A computerized method of selecting one of a plurality of data compression models for compressing data symbols in a stream of data symbols to maximize compression of the stream, comprising the steps of:
- using each of said plurality of models to form a respective block of compressed data from data symbols input from the stream, said forming beginning with the same data symbol in said stream and ending with said respective blocks of compressed data being of comparable size; and
- selecting the model which produces the block, from among said respective blocks, for which the most input symbols have been compressed.

12. The method of claim 11 wherein said blocks of compressed data are formed by the steps of:
- beginning with the same input symbol in said stream, using each model to generate respective strings of data from the stream of input symbols; and
- compression coding said strings of data to produce said blocks of compressed data.

13. The method of claim 12 wherein said respective blocks of compressed data are only completed after a less probable symbol has been coded.

14. A computerized method of dynamically selecting the best of a plurality of data compression models for use in arithmetic coding and decoding wherein each model generates a string of data in response to a stream of input symbols, comprising the steps of:
- beginning with the same symbol in said input symbol stream, using each of said models to produce respective strings of data from said input symbols including a model selection decision for the respective model;
- coding the model selection decision and the string of data for each model with an adaptive arithmetic coder to generate respective blocks of compressed data for each model, with each of said blocks being of at least a given size and starting the coding of each model for a given block with the same code stream and probability interval; and
- selecting the model with the best coding performance from among the blocks of compressed data generated during the arithmetic coding on the basis of the amount of input symbol data compressed.

15. A computerized system for maximizing the compression of a stream of input symbols by dynamically selecting the best of a plurality of data compression models for respectively encoding each of successive portions of said stream, wherein each model, in response to input symbols, generates encoded data, based on model characteristics, in the form of respective strings of data, comprising:
- means, beginning with the same input symbol in said stream, for generating respective strings of data from the stream of input symbols using each of said data compression models;
- means for compression coding said strings of data to produce respective blocks of compressed data, each of said blocks being at least equal to a given size;
- means for selecting the respective block of compressed data for which the most input symbols have been compressed;
- means for adding the selected block of compressed data to an output data stream; and
- means for actuating said foregoing means to act on the next succeeding portion of said input symbol stream, beginning with the input symbol following the last symbol input to said selected model, until all of the portions of said input stream have been compressed and added to said output data stream.

16. The system of claim 15 wherein said compression coding means comprises means for arithmetically coding said strings of data.

17. The system of claim 15 wherein said compression coding means comprises means for variable length coding said strings of data.

18. The system of claim 15 further comprising means for resetting the probability estimation values, associated with said blocks of compressed data, for the models not selected to the previous estimation values at the start of the production of the next block.

19. A computerized system for selecting one of a plurality of data compression models for compressing data symbols in a stream of data symbols to maximize compression of the stream, comprising:
- means, using each of said plurality of models, for forming a respective block of compressed data from data symbols input from the stream, said forming beginning with the same data symbol in said stream and ending with said respective blocks of compressed data being of comparable size; and
- means for selecting the block, from among said respective blocks, for which the most input symbols have been compressed.

20. A computerized system for dynamically selecting one of a plurality of data compression models for use in arithmetic coding and decoding wherein each model generates a string of data in response to a stream of input symbols, comprising the steps of:
- means, beginning with the same symbol in said input symbol stream, for producing respective strings of data from said input symbols using each of said models and including a model selection decision for the respective model;
- adaptive arithmetic coder means for coding the model selection decision and the string of data for each model to generate respective blocks of compressed data for each model, with each of said blocks being of at least a given size and starting the coding of each model for a given block with the same code stream and probability interval; and
- means for selecting the model with the optimum coding performance from among the blocks of compressed data generated during the arithmetic coding on the basis of the amount of input symbol data compressed.

* * * * *